United States Patent [19]
Friedl

[11] Patent Number: 4,843,310
[45] Date of Patent: Jun. 27, 1989

[54] ELECTRICITY METER WITH ARRANGEMENT FOR MONITORING CORE SATURATION INCIDENTS

[75] Inventor: Richard Friedl, Braunschweig, Fed. Rep. of Germany

[73] Assignee: LGZ Landis & GYR ZUG AG, Zug, Switzerland

[21] Appl. No.: 861,600

[22] Filed: May 9, 1986

[30] Foreign Application Priority Data

Jun. 15, 1985 [DE] Fed. Rep. of Germany ....... 3521546

[51] Int. Cl.$^4$ .................. G01R 1/20; G08B 21/00; H02H 7/045
[52] U.S. Cl. .................................. 324/127; 324/55; 324/110; 340/646; 361/36; 361/93
[58] Field of Search ............... 324/127, 55, 117 R, 324/110, 142; 340/646; 361/36, 35, 42, 93

[56] References Cited

U.S. PATENT DOCUMENTS

| | | | |
|---|---|---|---|
| 3,532,934 | 10/1970 | Ballman | 361/93 |
| 3,775,675 | 11/1973 | Freeze et al. | 340/646 |
| 3,934,194 | 1/1976 | Paprocki | 324/55 |
| 4,222,086 | 9/1980 | Runyon | 361/93 |
| 4,225,899 | 9/1980 | Sotiriou | 361/42 |

FOREIGN PATENT DOCUMENTS 0101726 8/1981 Japan ........................ 361/36

Primary Examiner—Ernest F. Karlsen
Attorney, Agent, or Firm—Marmorek, Guttman & Rubenstein

[57] ABSTRACT

A device for use in connection with electricity meters incorporating current transformers is disclosed. The device detects saturation incidents of the magnetic cores of the transformers, thereby reducing measurement errors.

9 Claims, 4 Drawing Sheets

ELECTRICITY METER WITH ARRANGEMENT FOR MONITORING CORE SATURATION INCIDENTS

FIELD OF THE INVENTION

The present invention relates to electricity metering devices. More particularly, the present invention relates to electricity meters incorporating current transformers and a device for determining metering errors due to overloading of the core of the current transformer.

BACKGROUND OF THE INVENTION

With the arrival of static electronic electricity meters, the question arises as to how dependable these meters are without maintenance over decades. Since the failure rate of these meters is roughly proportional to the number of electronic components, it is advisable to use as few electronic components as possible for the metering of electricity usage.

Meters for measuring electrical current consumption often incorporate current transformers or shunts. The use of shunts is generally practical only for one-phase alternating current meters. In the case of three phase electricity meters, galvanic separation of the circuits from one another proves to be necessary, so that one use of a current transformer is usually required. With the use of such transformers, one problem is magnetic saturation incidents, i.e. overloads of the transformer core. Such magnetic core saturation incidents lead to under measurement of energy consumption. Saturation incidents arise from excess currents and from D.C. components in the current, formed for instance by one way rectification. There are so called active current transformers with electronic auxiliary current circuits which make sure that a saturation of the transformer core is avoided. Such active current transformers have the disadvantage that they increase the complexity of the electronic meter. This increases the failure rate and reduces the length of time the electronic meters may be used.

Direct current components in the consumer current circuit of utility company electricity customers normally occur in connection with the intended stealing of electricity. I.e., if the use of direct current components could be excluded, then the classical passive current transformers (rather than the aforementioned active current transformers) would be sufficient. Thus the question arises, if it is necessary and economically sensible to equip all static electricity meters that are supposed to be installed in the network with the relatively complex active current transformer. Such active current transformers decrease the standard time of validity of the calibration of the meter and are insensitive to direct current. Alternatively, one may look for ways to detect the few customers that take substantial direct current out of the network.

SUMMARY OF THE INVENTION

It is the object of this invention to detect those consumers of electrical energy that disrupt the consumption measurements of electricity meters, may it be unintentionally or intentionally —for instance by taking current through one way rectification. Thus, the present invention is an electricity meter incorporating a current transformer and a device for the determination of measurement errors due to overload of the magnetic core of the current transformer. It is characterized by the fact that the electricity meter is additionally equipped with detectors that detect, indicate and/or register the duration of saturation incidents in the current transformer core, either indirectly by registering the direct current components in the current to be measured or directly.

DETAILED DESCRIPTION OF THE INVENTION

Figure 1:
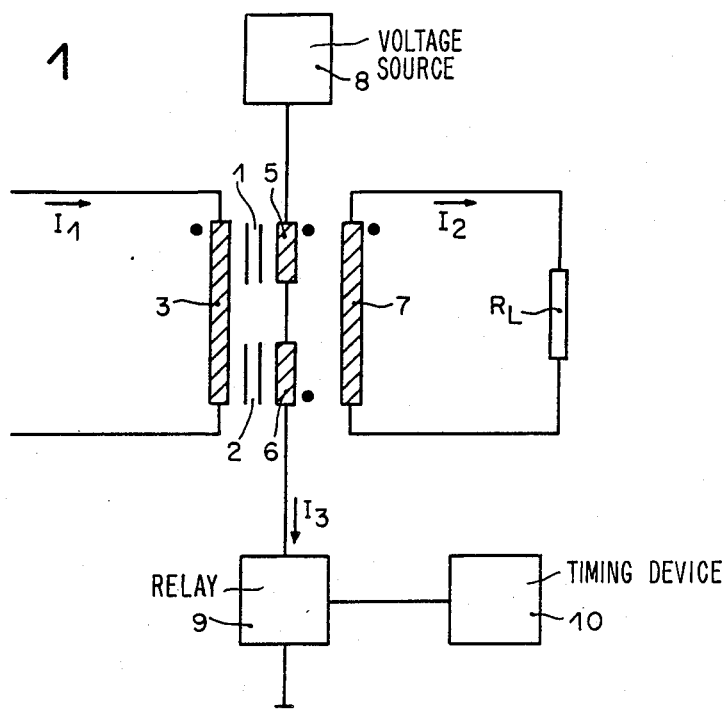
FIGS. 1, 2, and 3 schematically illustrate devices for detecting core saturation incidents in transformers incorporated into single-phase electricity meters, in accordance with illustrative embodiments of the present invention.

An embodiment of the invention for the direct detection of core saturation incidents is illustrated in FIG. 1. The device of FIG. 1 is a current transformer comprising two magnetic cores 1 and 2. The cores 1 and 2 are both surrounded by a winding 3 that is carrying the primary current to be measured $I_1$ and has the winding number $W_1$. The cores 1 and 2 are also surrounded by the winding 7 that is carrying the secondary current $I_2$ and has the winding number $W_2$. In addition the magnetic cores 1 and 2 each carry another winding 5 and 6, respectively, with the winding numbers $W_{31}$ and $W_{32}$ with $W_{31} = W_3$, when the winding direction of the winding 5 is opposite to the winding direction of the winding 6. For an auxiliary alternating current $I_3$ produced by an auxiliary alternating voltage source 8, the windings 5 and 6 form two equally large impedances connected in series. The magnetic fluxes produced in the cores 1 and 2 by the auxiliary alternating current $I_3$ flowing through the windings 5 and 6 are thus equally large. In the secondary winding 7, these fluxes induce the same alternating currents, however with opposite polarity, so that they neutralize each other and do not result in any current in the secondary winding 7. That means, the winding 7 is decoupled from the windings 5 and 6. Equally, the winding 3 is decoupled from the windings 5 and 6.

The way this arrangement works is the following: In the case of normal operation, the transformer core has a relatively high permeability that leads to a high impedance in the windings 5 and 6, so that the current $I_3$ that is driven in these windings by the auxiliary alternating voltage $U_H$ is relatively small. The permeability decrease, occurring in the case of overloading and in the case of primary direct currents and caused by saturation incidents in the core, leads to a diminishing of the impedances of the windings 5 and 6 and thereby to an increase of the current $I_3$. When the current $I_3$ crosses a threshold value, a signal relay 9 is triggered. If desired, the signal relay a may be connected to an additional timing device 10. The timing device 10 may be used to register the duration of magnetic core saturation incidents.

Figure 2:
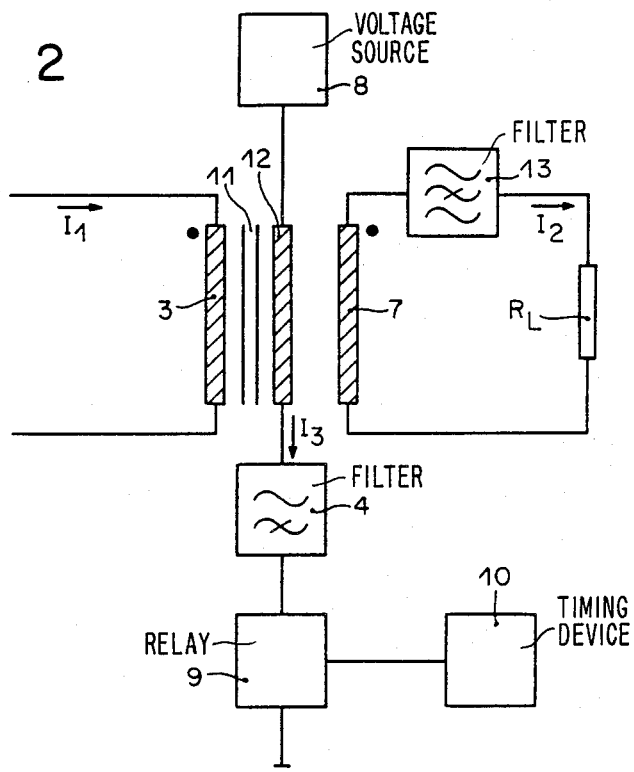

Another embodiment of the invention is illustrated in FIG. 2. The embodiment of the invention shown in FIG. 2 comprises a transformer with only one magnetic core 11. Coil 3 carries the primary current to be measured $I_1$. Coil 7 carries the secondary current $I_2$ and coil 12 carries the auxiliary current $I_3$. Decoupling between the auxiliary alternating current $I_3$ and the secondary current $I_2$ is achieved by a filter circuit 13 which is non-passing at the frequency of the auxiliary alternating current $I_3$. Similarly the filter 4 is non-passing for current components in the auxiliary alternating current $I_3$ with the frequency of the measuring current. $I_1$.

Advantageously, use of the filters 4 and 13 renders unnecessary use of a transformer with 2 cores. However a disadvantage in contrast to FIG. 1 is, that the frequency of the auxiliary alternating current should generally be clearly different from the frequency of the primary current to be measured.

Figure 4:
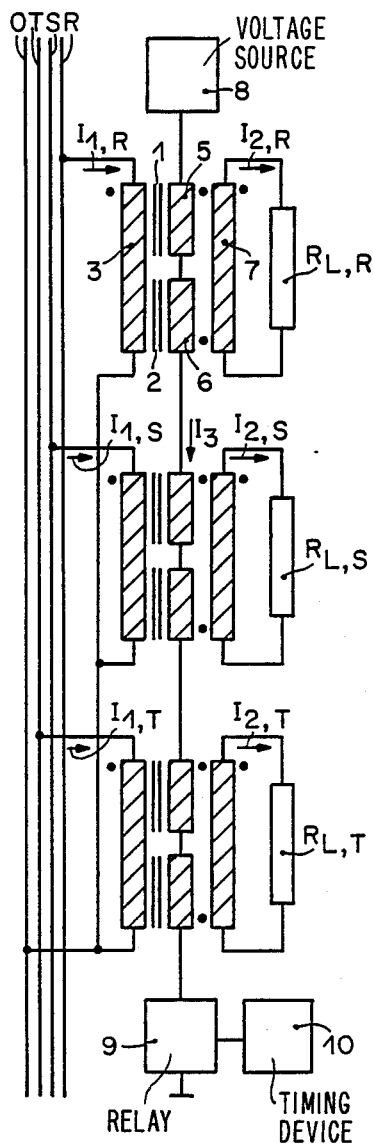
FIGS. 4, 5, 6 and 7 schematically illustrate embodiments relating to FIGS. 1 and 2 but for multi-phase electricity meters.
Figure 5:
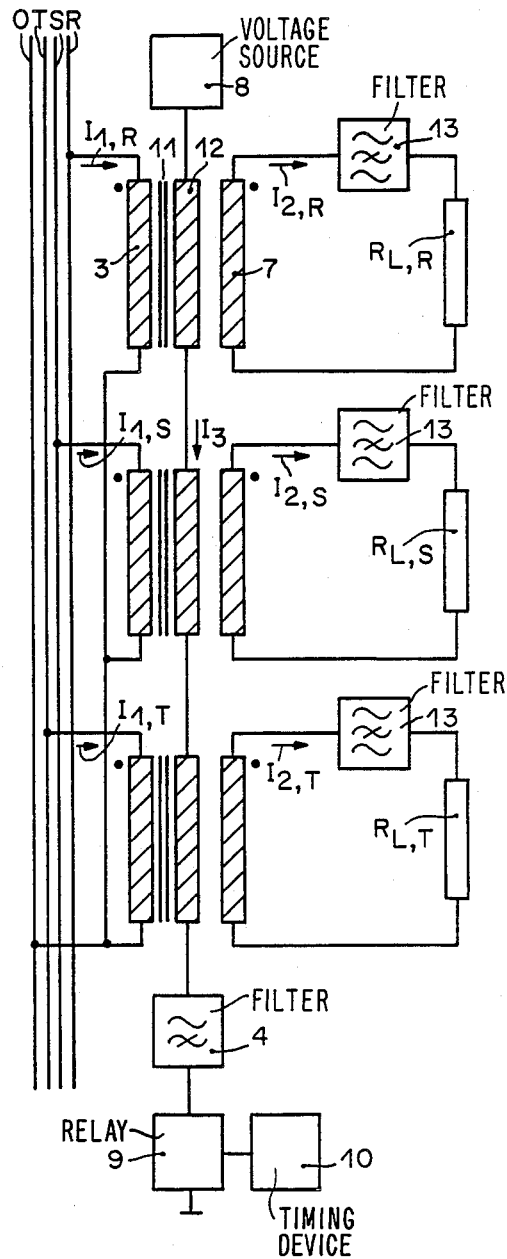
Figure 6:
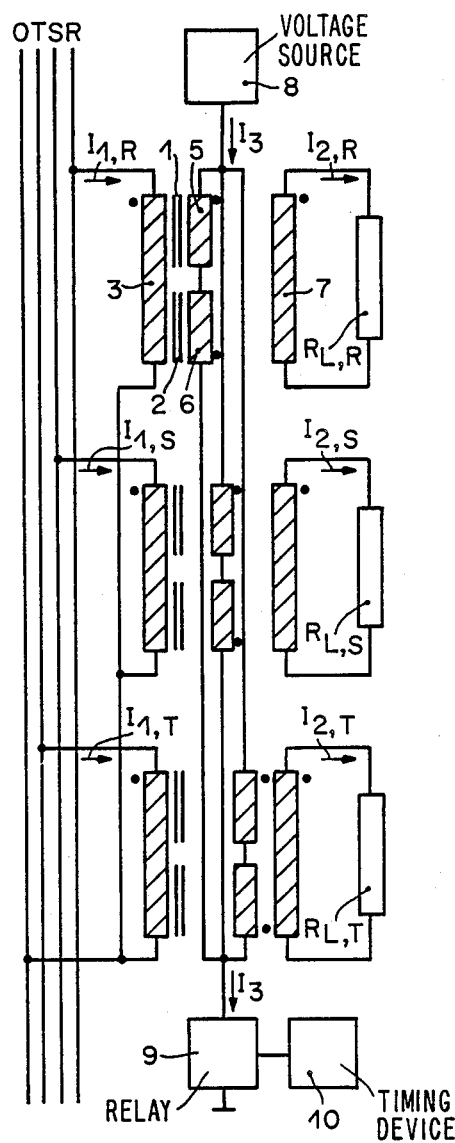
Figure 7:
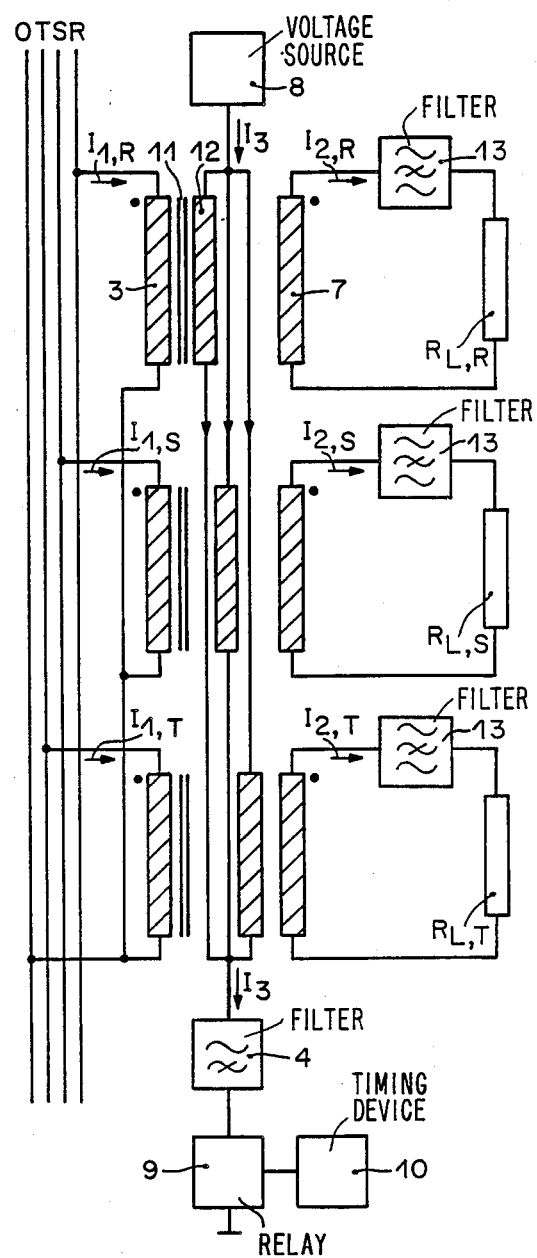

In accordance with the present invention, the arrangement illustrated in FIGS. 1 and 2 may be used, in connection with one-phase and multi-phase meters. In the case of a multiphase meter, the auxiliary voltage source 8 and the indicator elements 9 and 10 only need to be present once. Illustratively, in a multiphase meter, auxiliary windings of the individual current transformers may be connected in series as shown in FIGS. 4 and 5. The auxiliary current $I_3$ flows through the series connected auxiliary current windings W3 of the individual current transformers. Alternatively, the auxiliary current can be divided over the individual auxiliary current windings as shown in FIGS. 6 and 7 and, afterwards, be led as a summed current to the indicator element or elements 9, 10.

Figure 3:
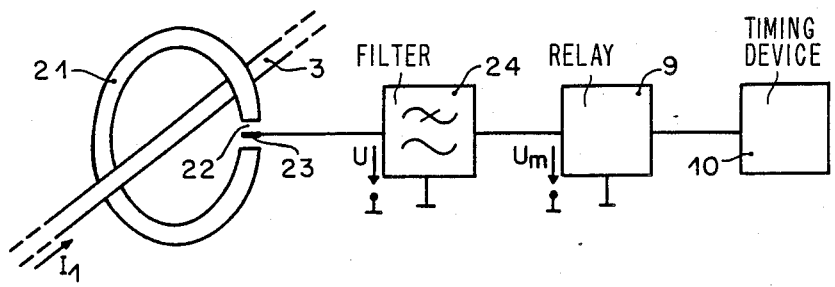

A detector in accordance with FIG. 3 illustrates an embodiment of the invention for the indirect registration of the saturation incidents by way of detection of direct current components of the current to be measured.

Turning to FIG. 3, the current $I_1$ to be measured flows in the conductor 3. In the air gap 22 of the magnetic core 21 that is activated by the measuring current $I_1$, a known magnetic field dependent sensor 23 is situated. The sensor 23 uses either the hall effect, the magneto-optical or the magneto-resistive effect. The output voltage U of the sensor 23 is processed with the help of filter 24 to form the D.C. voltage mean value $U_m$. The voltage $U_m$ is formed with a threshold frequency that is very low in contrast to the frequency of the measuring current $I_1$. This D.C. voltage mean value $U_m$ is indicative of the direct current component in the current $I_1$ to be measured and thus also for the saturation state (overload state) of the current transformer core (not shown in FIG. 3). When the voltage $U_m$ crosses a predetermined threshold value, the voltage $U_m$ or rather a signal derived from the voltage $U_m$, causes the activation of the indicator element 9 and, if desired, also a timing device 10 for registration and cumulation of all the times when an overloading (saturation) of the magnetic core occurred, i.e. when the measurement of the consumer energy was substantially incorrect.

The output of the core overload detector can be used to provide a signal which at least partially compensates for the under measurement of electricity consumption during magnetic-core saturation incidents. In other words, besides the mere indication of the error occurrence by elements 9 and 10, it is also possible, in accordance with FIG. 1, to provide an additional signal that is derived from the auxiliary alternating current $I_3$ or from the core saturation detector output signal. The additional signal is lead to the current or voltage signal input or to both inputs of the multiplier of the electricity meter when the threshold value is crossed. Thus, the under-measurement of energy consumption that was caused by overloading of the current transformation core is at least partially equalized.

Finally, the above described embodiments of the invention are intended to be illustrative only. Numerous alternative embodiments may be derived by those skilled in the art without departing from the spirit and scope of the following claims.

I claim:

1. In an electricity meter, an arrangement comprising:
at least one current transformer including at least one magnetic core, a first winding surrounding said magnetic core and operable for carrying a primary current to be measured, and a second winding surrounding said magnetic core and operable for carrying a secondary current; and
means for determining measurement errors due to saturation of said magnetic core including detecting means operable for indicating each occurrence of saturation of said magnetic core and accumulating means for accumulating the durations of the occurrences of saturation of said magnetic core.

2. The arrangement of claim 1, wherein:
said current transformer comprises at least one auxiliary winding surrounding said magnetic core and operable for carrying an auxiliary current; and
said means for determination of measurement errors due to saturation of said magnetic core comprises at least said one auxiliary winding, wherein a change in the permeability of said magnetic core produces a change in said auxiliary current.

3. The electricity meter of claim 2, wherein:
said current transformer comprises first and second magnetic cores, and first and second auxiliary windings; said first and second auxiliary windings forming part of said detecting means;
said first and second auxiliary windings surrounding said first and second magnetic cores respectively;
said first and second auxiliary windings being connected in series with each other and being operable for carrying one auxiliary current so that said auxiliary current through said first and second auxiliary windings produces magnetic fluxes of opposite polarity but substantially equal magnitude, whereby the voltages induced by said magnetic fluxes in said first and said second windings substantially cancel each other; and
wherein a change in the permeability of said first and second magnetic cores produces a change in said auxiliary current.

4. The electricity meter of claim 2, wherein:
the frequency of said primary current is different from the frequency of said auxiliary current;
said secondary winding being connected to first filter means, which is non-passing for said frequency of said auxiliary current; and
said detecting means comprising second filter means, which is non-passing for said frequency of said primary current.

5. The electricity meter of claim 1, wherein:
said means for determining measurement errors due to saturation of said magnetic core comprises an additional magnetic core activated by said primary current;
said additional magnetic core having an air gap in which a magnetic field sensor is positioned; and
said detecting means comprising filter means for filtering the output of said magnetic field sensor to produce a direct current average signal.

6. The electricity meter of claim 3 wherein there are a plurality of said current transformers, means for connecting the auxiliary windings of said current transformers in series and means for connecting said serially connected auxiliary windings to said detecting means.

7. The electricity meter of claim 3 wherein there are a plurality of said current transformers, means for connecting the auxiliary windings of said current transformers so that the respective auxiliary currents in said auxiliary windings are summed and means for connecting said connected auxiliary windings to said detecting means.

8. The electricity meter of claim 4 wherein there are a plurality of said current transformers, means for connecting the auxiliary windings of said current transformers in series and means for connecting said serially connected auxiliary windings to said detecting means.

9. The electricity meter of claim 4 wherein there are a plurality of said current transformers, means for connecting the auxiliary windings of said current transformers so that the respective auxiliary currents in said auxiliary windings are summed and means for connecting said connected auxiliary windings to said detecting means.

* * * * *